US005300827A

United States Patent [19]

Michail et al.

[11] Patent Number: 5,300,827

[45] Date of Patent: Apr. 5, 1994

[54] NOISE IMMUNE NTL LOGIC NETWORK

[75] Inventors: Michel S. Michail, Wappingers Falls; James L. Walsh, Hyde Park, both of N.Y.

[73] Assignee: International Business Machines Corporation, Armonk, N.Y.

[21] Appl. No.: 920,401

[22] Filed: Jul. 27, 1992

[51] Int. Cl.$^5$ .............................................. H03K 19/013

[52] U.S. Cl. ...................................... 307/443; 307/454

[58] Field of Search ................ 307/443, 290, 454–455, 307/562

[56] References Cited

U.S. PATENT DOCUMENTS 4,605,870 8/1986 Dansky et al. ...................... 307/443
4,631,427 12/1986 Mazumder .......................... 307/455
4,694,198 9/1987 Umeki ............................... 307/290
4,710,793 12/1987 Gray .............................. 307/455 X
4,719,367 12/1988 Denda ................................ 307/290
4,806,785 2/1989 Michail et al. .................. 307/443 X
4,806,791 2/1989 Mizuide .......................... 307/290 X
4,871,977 10/1989 Schilling et al. .................... 307/255

OTHER PUBLICATIONS

E. L. Carter et al., Dual Phase Hysteresis Logic Circuit, IBM Technical Disclosure Bulletin, vol. 31, No. 4, Sep. 1988.

P. R. Epley et al., Schmitt Trigger Circuit IBM Technical Disclosure Bulletin, vol. 16, No. 5, Oct. 1973.

*Primary Examiner*—David R. Hudspeth
*Attorney, Agent, or Firm*—Whitham & Marhoefer

[57] ABSTRACT

An NTL (Non-Threshold Logic) NOR logic circuit exhibits a small signal swing, effected by establishing a pseudo threshold level by utilizing a low voltage power supply and a combination of NPN bipolar devices arranged to provide an essentially noise immune circuit having high DC gain and high AC noise tolerance.

4 Claims, 4 Drawing Sheets

Vcc
R1
R2
T4
T6
F.O.=3
A
B
C
T1
T2
T3
$\overline{A+B+C}$
R4
C LOAD
Vt
C SPEED
T5
R3
Vee INPUT VOLT
GAIN
11
10
5
0
1.50
1.40
1.30
1.20
1.10
1.00
0.90
0.80
0.70
0.60
TWO STAGES
GAIN
ONE STAGE
TIME
OUTPUT VOLT
1.40
1.20
1.00
0.80
0.60
ma
OR
VOLT POWER SUPPLY NOISE
V INPUT (up), $C_S$=.1
(Vcc v +INPUT v) (up), $C_S$=.1
0.50
0.40
0.30
0.20
0.10
ma
OR
VOLT
0
500
1,000
1,500
2,000
2,500
3,000
3,500
4,000
WIDTH INPUT VOLT
OUTPUT VOLT
IR3
IRE·T4
IRE·T1
TIME
ma OR VOLT
1.00
0.50
0.00
5,000
5,100
5,200
5,300
5,400
5,500
5,600
5,700
5,800
5,900
6,000

NOISE IMMUNE NTL LOGIC NETWORK

BACKGROUND OF THE INVENTION

1. Field of the Invention

The present invention generally relates to resistor transistor logic (RTL) circuitry and, more particularly, to a noise immune non-threshold logic (NTL) circuit utilizing NOR logic.

2. Description of the Prior Art

The prior art is replete with various types of voltage comparators and threshold level setting schemes, but invariably these circuits suffer from very poor AC noise tolerance, very low DC gain and relatively slow switching times. Most of these circuits utilize PNP bipolar transistor and field effect transistor (FET) devices in various configurations of schmitt triggers or differential comparators to effect some desired logic function.

SUMMARY OF THE INVENTION

It is therefore a primary object of the present invention to provide a NOR logic circuit exhibiting a small signal swing, effected by establishing a pseudo threshold level by utilizing a low voltage power supply and a combination of NPN bipolar transistor devices arranged to provide an essentially noise immune circuit having high DC gain and high AC noise tolerance.

The shortcomings of the prior art have been effectively overcome by utilizing a unique RTL logic circuit using NPN bipolar transistor devices, which are less costly, easier and more reliably reproduced with less rejects than complementary bipolar and BIFET devices. The desired configuration establishes a pseudo threshold level which reduces the need for large voltage swings to compensate for poorly defined threshold regions.

According to the invention, there is provided an NTL (Non-Threshold Logic) circuit having a plurality of NOR input gates with an emitter follower output interacting with a voltage divider and a current control device for establishing the pseudo threshold level, whereby triggering of the input gates occurs rapidly with minimal hystoresis effect and excellent AC noise tolerance. More particularly, the output of the logic circuit is fed back to set the base voltage of a current source transistor, thereby altering the circuit's operating point.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
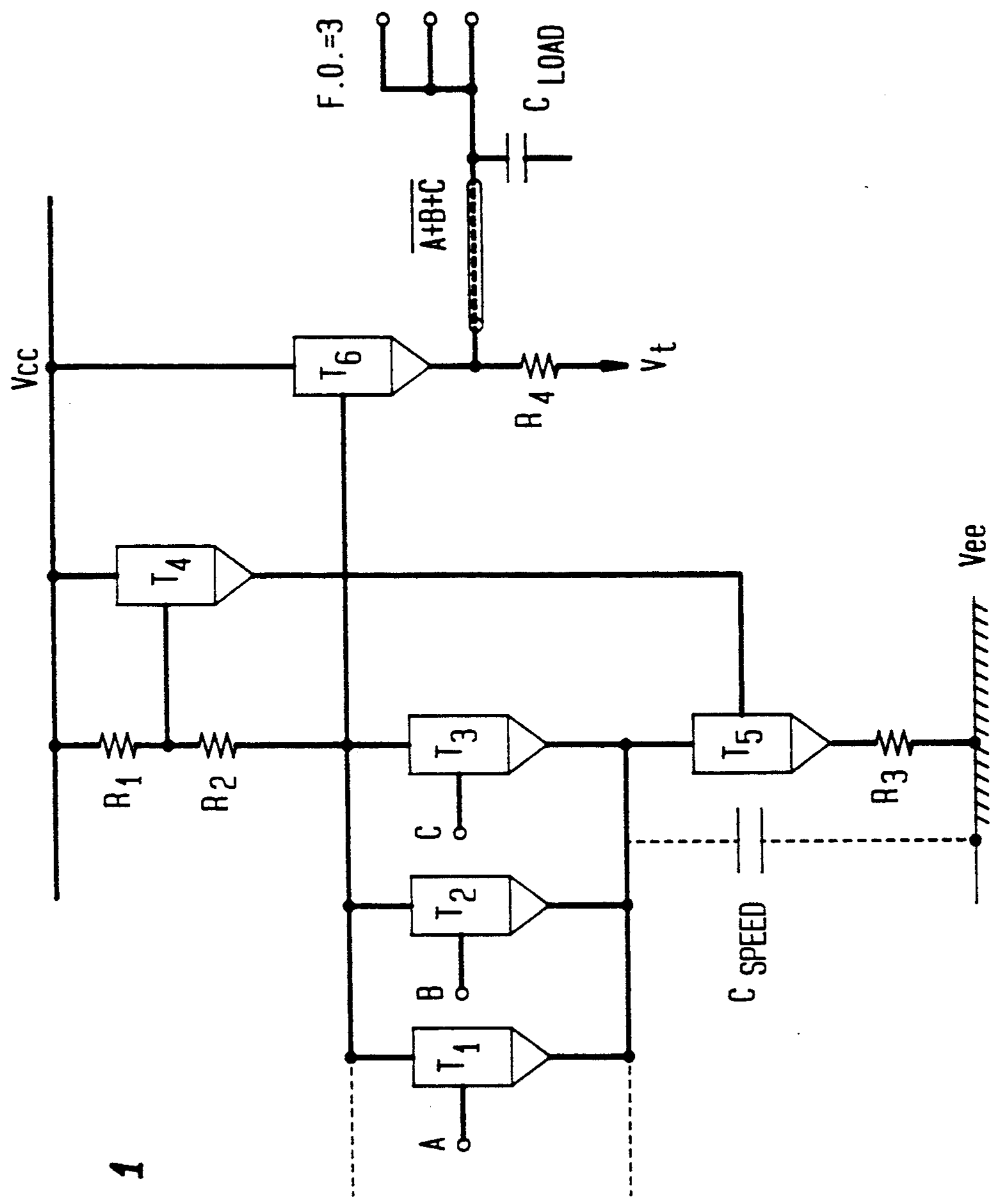
FIG. 1 depicts a schematic diagram of the preferred embodiment of the invention.

Referring now to the drawings, and more particularly to FIG. 1, there is shown a three input NOR gate comprising bipolar NPN transistors T1, T2 and T3, which is representative of a NOR logic input circuit and may accommodate as many inputs as the application requires. Transistors T4 and T6 are emitter followers. Transistor T4 drives transistors T5 which is connected to the common emitter circuit of transistors T1, T2 and T3. Transistor T5 is a current control device to enhance the speed of operation of the NOR gate and remains saturated throughout the operation of the circuit. The emitter follower output from transistor T6 may drive cell-to-cell wiring and allow for emitter dotting.

The pseudo threshold level is established at the base of transistor T4 and is essentially determined by the ratio of resistors R1 to R2 connected as a voltage divider which, under normal conditions, forward biases the base-emitter junction of transistor T4 whereby transistor T5 functions in its saturated state. With low logic level inputs, transistor T4 is biased to a state of conduction and supplies a current to the base of transistor T5, maintaining transistor T5 in a state of saturation, while the emitter follower T6 is maintained at a high level of conduction and provides an output in the absence of an input to the NOR circuit. Now, upon the application of a high logic level to one or more inputs to the NOR gate(s), the current flows through resistors R1 and R2, the NOR gate(s), transistor T5 and resistor R3 thus lowering the voltage at the base of transistor T4. Simultaneous with the drop in potential at the common node of resistors R1 and R2 and base of transistor T4, a drop in potential also occurs at the base of transistor T6, placing transistor T6 in the low conduction state. The IR drop across resistors R1 and R2 provides the logic signal swing, thus establishing the down logic level. The high level is established by the Vcc supply, when the inputs to transistors T1, T2 and T3 are low. Transistor T5 is still in saturation at this condition, and the saturation current is supplied as base current to transistor T5 through transistor T4.

Figure 2:
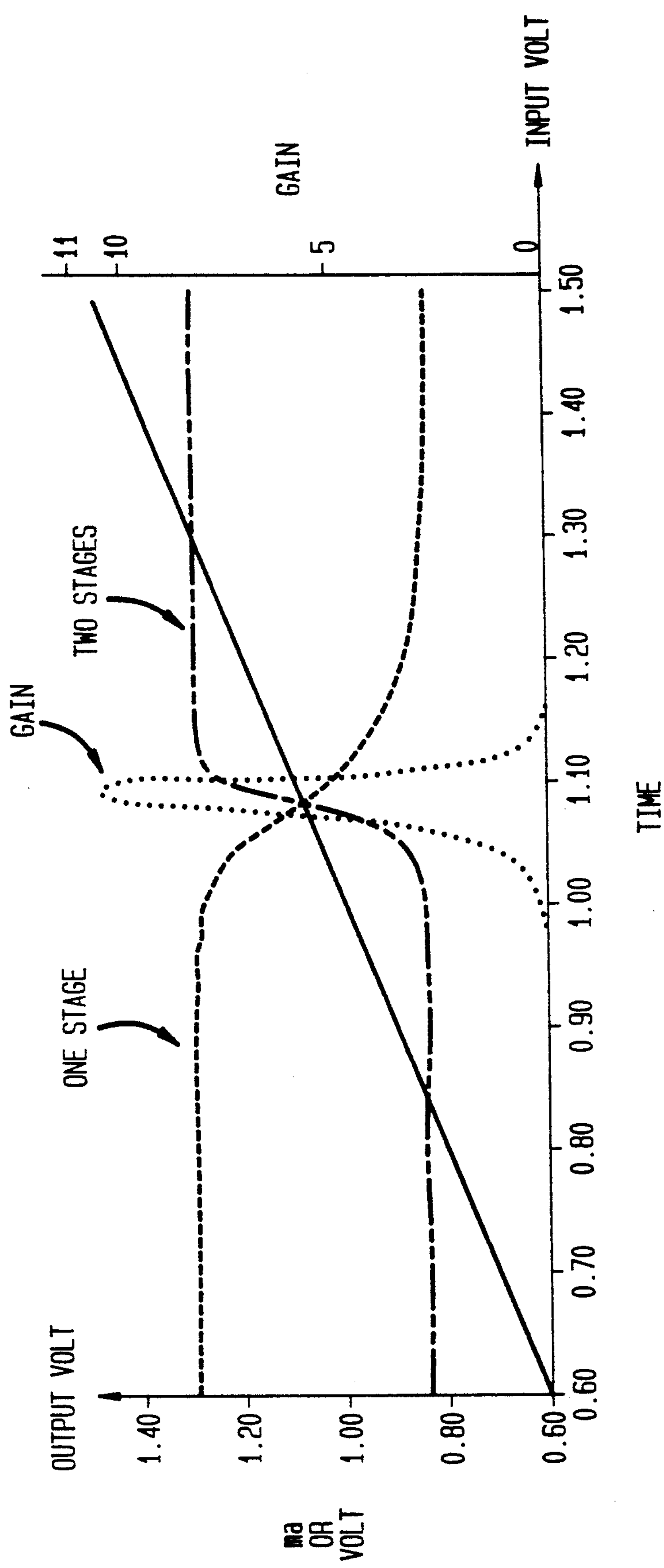
FIG. 2 shows the DC characteristic curves for the operation of the circuit of FIG. 1.
Figure 3:
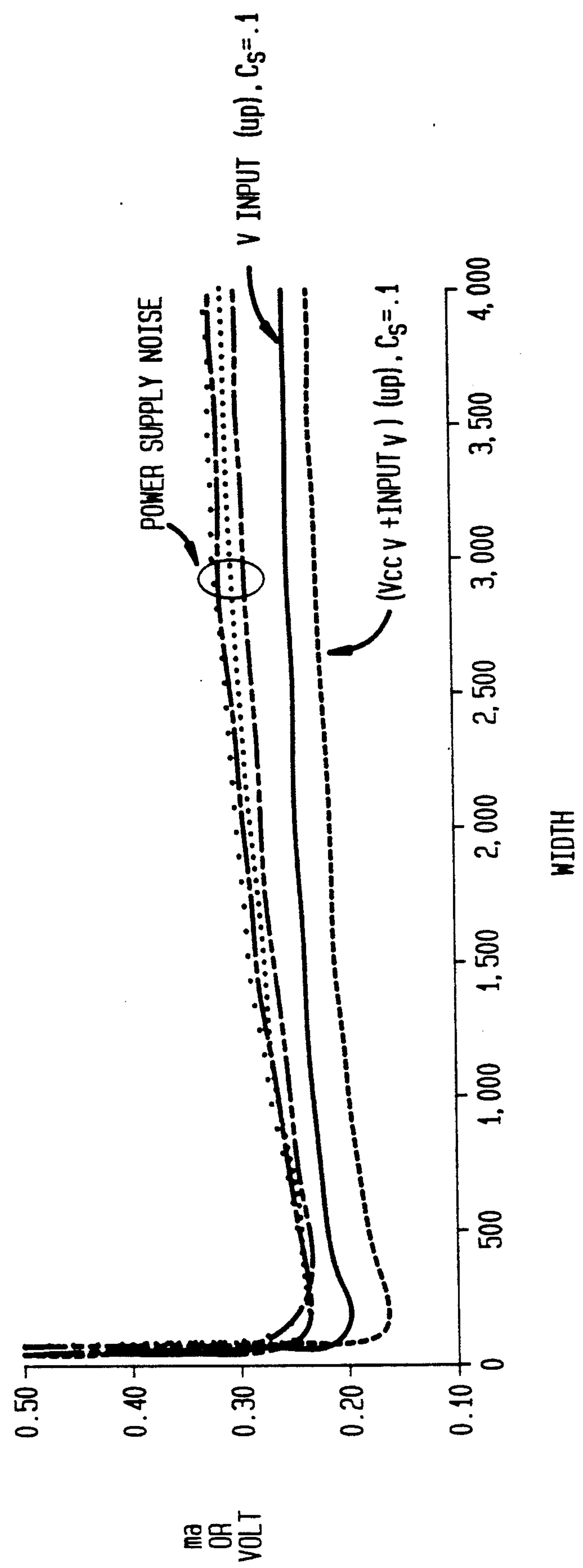
FIG. 3 provides curves of the AC noise tolerance of the instant invention.
Figure 4:
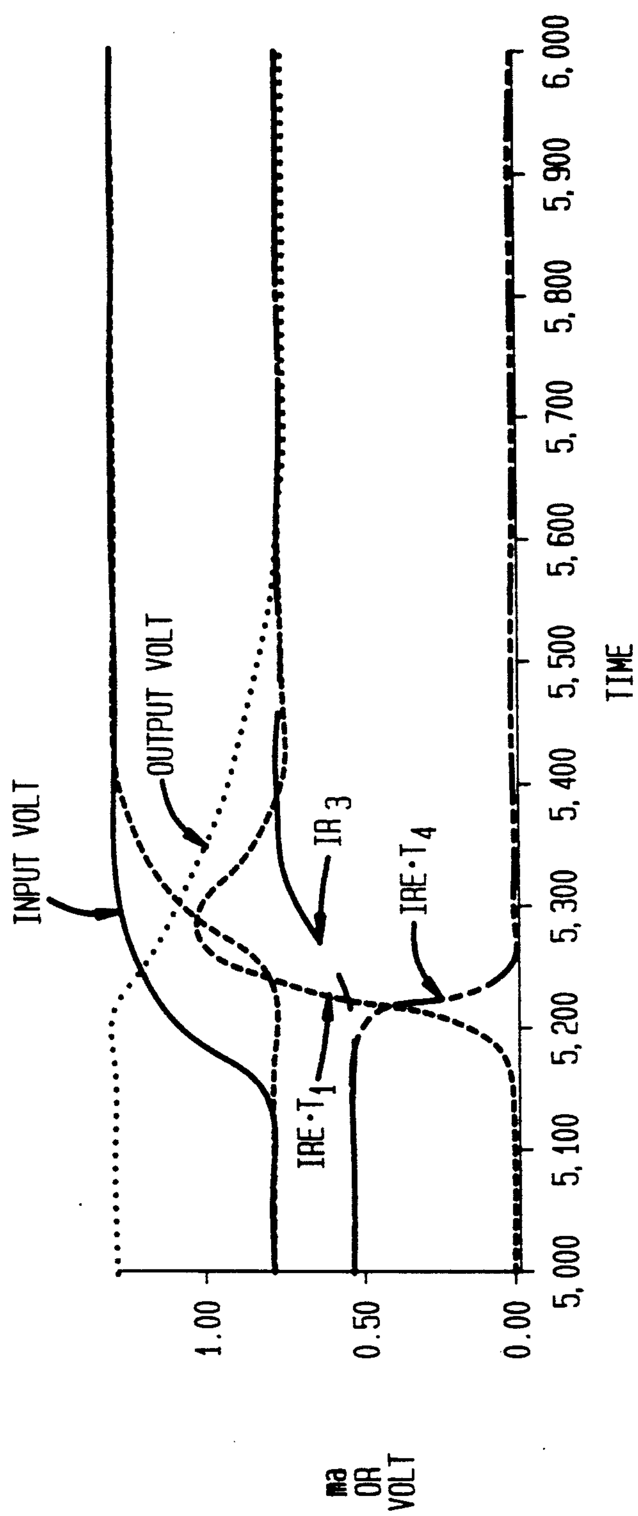
FIG. 4 presents the voltage and current waveforms of the circuit of FIG. 1.

The basic NOR circuit of FIG. 1 establishes the DC levels, as seen in FIGS. 2 and 4. A low supply voltage across the NOR logic circuit helps to reduce the power consumption of the circuit. As seen in FIG. 2, this circuit has "high gain" DC characteristics and, as seen in FIG. 3, it exhibits good AC noise tolerance on both input and power supplies. Referring again to FIG. 4, the saturation current in relation to input and output voltages is shown represented by the waveform of the current flow through R3 and switches between 0.5 and 0.75 milliamperes (ma). The waveforms shown in FIG. 4 are based on a design with signal swing level equal to 550 millivolts (mv). This does not necessarily represent the optimum design point, but it demonstrates the designability of the circuit. The power in this case, is 1.85 milliwatts (nw), and the average delay, for $C_{load}=0.15$ picafarads (pf), is 53 picaseconds. The referred to pseudo threshold level tracks extremely well with Vcc and is established at the base of transistor T4, which is determined by the ratio of resistors R1 to R2. The down level stays constant with respect to the power supply. As noted above, the transistor T5 remains saturated regardless of the presence or absence of inputs to the NOR circuit; therefore, the current through transistor T5 remains constant as a function of the voltage variation of either the up or down input levels. This action gives the circuit the excellent AC noise tolerance characteristic as seen in FIG. 3.

FIG. 1 also shows a capacitor across transistor T5 and resistor R3 which is optional and will function to further speed up the switching of the logic circuit.

Thus, while the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A high speed, low power NOR logic circuit having good AC noise tolerance comprising:

- a high voltage supply line;
- a low voltage supply line;
- a voltage divider, a plurality of input logic bipolar gates having emitter, collector and base connection and a current control device, all coupled in series between the high and low voltage supply lines; and
- an emitter follower circuit coupled across the voltage divider for effecting a NOR output in the absence of an input to any of the input logic gates, the emitter follower circuit including first and second bipolar devices, each having a base, an emitter and a collector, with the base of the first bipolar device connected to the midpoint of the voltage divider, the collector thereof connected to the high voltage supply line and the emitter connected to said current control device to maintain the device in a state of saturation, with the base of the second bipolar device connected to one end of the voltage divider and the collector connections of the input logic bipolar devices, the collector thereof coupled to the other end of the voltage divider and the emitter thereof coupled to an output circuit for effecting an emitter follower output in accordance with the logic input.

2. The logic circuit as set forth in claim 1, wherein the current control device is a bipolar device having an emitter, a collector and a base, with the collector being connected to the emitter connections of the input logic bipolar gates, the emitter coupled to the low voltage supply line and the base connected to the emitter of the said first bipolar device in the emitter follower output circuit, such that upon triggering one or more of the input gates the emitter follower circuit becomes non-conducting, thus effecting an output signal across the emitter load of the second bipolar device of the emitter follower circuit indicative of the logic input.

3. The logic circuit as set forth in claim 2, wherein all the bipolar devices are NPN transistors.

4. The logic circuit of claim 1, wherein the output of the first bipolar device functions as a feedback signal to set the base voltage of a current source transistor, thereby altering and establishing the circuit's operating point.

* * * * *